United States Patent [19]

Slater

[11] Patent Number: 4,891,827
[45] Date of Patent: Jan. 2, 1990

[54] LOADABLE RIPPLE COUNTER

[75] Inventor: Andrew E. Slater, Maynard, Mass.

[73] Assignee: Digital Equipment Corporation, Maynard, Mass.

[21] Appl. No.: 164,584

[22] Filed: Mar. 7, 1988

[51] Int. Cl.⁴ .............................. H03K 21/02
[52] U.S. Cl. .................................. 377/111; 377/116; 377/107
[58] Field of Search .................. 377/116, 111, 107

[56] References Cited

U.S. PATENT DOCUMENTS

| | | | |
|---|---|---|---|
| 4,037,085 | 7/1977 | Minorikawa | 377/116 |
| 4,521,898 | 6/1985 | Akram | 377/116 |
| 4,611,337 | 9/1986 | Evans | 377/116 |
| 4,727,559 | 2/1988 | Yokoyama et al. | 377/116 |

OTHER PUBLICATIONS

Millman, *Microelectronics*, (McGraw-Hill 1979), pp. 220–222.

Primary Examiner—John S. Heyman
Attorney, Agent, or Firm—Fish & Richardson

[57] ABSTRACT

A loadable N-bit ripple counter having N bit subcircuits that each inlude a flip-flop and a bit loading element. The flip-flop output is controllable to a known state when a flip-flop control signal is asserted. The bit loading element is connected to receive the flip-flop output and a bit input of a multibit number being loaded and to provide a bit output of the counter, the bit output being controlled by the states of the flip-flop output and the bit input, and, except for the most significant bit, serving as a clock for the next more significant bit subcircuit.

9 Claims, 1 Drawing Sheet

LOADABLE RIPPLE COUNTER

BACKGROUND OF THE INVENTION

The present invention relates to loadable ripple counters.

Counters count sequential input pulses, providing a parallel output indicating the counted value. Ripple counters routinely employ flip-flops configured to alternate their outputs upon each clock pulse. An N-bit ripple counter employs N flip-flops connected in a chain so that each flip-flop output both clocks the next flip-flop and is used as a bit of the N-bit parallel output of the counter. A ripple counter having this configuration is described in Millman, *Microelectronics*, (McGraw Hill 1979), pp. 220–222.

Loadable N-bit ripple counters are configured to be loaded with an N-bit parallel input so that counting begins at the loaded number. An example of a common prior art loadable ripple counter is shown in FIG. 1 and described in detail below.

SUMMARY OF THE INVENTION

In general the invention features a loadable N-bit ripple counter having N bit subcircuits, each employing a flip-flop and a bit loading element. The flip-flop is configured to alternate its flip-flop output every time that it receives a clock pulse and has means to control its output to a known state when a flip-flop control signal is asserted. The bit loading element is inputted with the flip-flop output and a bit input of a multibit number being loaded into the counter and outputs a bit output of the counter. The bit output is controlled by the states of the flip-flop output and the bit input. Such a counter uses fewer gates than prior loadable ripple counters, saving space and expense.

In some preferred embodiments the bit loading element is a gate (most preferably an exclusive-NOR gate); and in some other preferred embodiments, the bit loading element is a multiplexer having two signal inputs connected to receive true and complement flip-flop outputs and a control input that determines whether the true output or the complement output is provided as the multiplexer output. In preferred embodiments the bit output, except for the most significant bit, serves as a clock for the next more significant bit subcircuit; the flip-flops are set to known states by clearing them; and the flip-flop output is connected to its D input to cause its output to alternate state. When implemented in gate arrays, fewer nets are needed than with prior ripple counters. In integrated circuits employing a plurality of ripple counters according to the invention, the savings in space may permit use of a smaller die size.

Other advantages and features of the invention will be apparent from the following description of preferred embodiments thereof and from the claims.

DESCRIPTION OF THE PREFERRED EMBODIMENTS

Drawings

FIG. 1, labeled prior art, is a schematic of a known loadable three-bit ripple counter.

Prior Art

Figure 1:
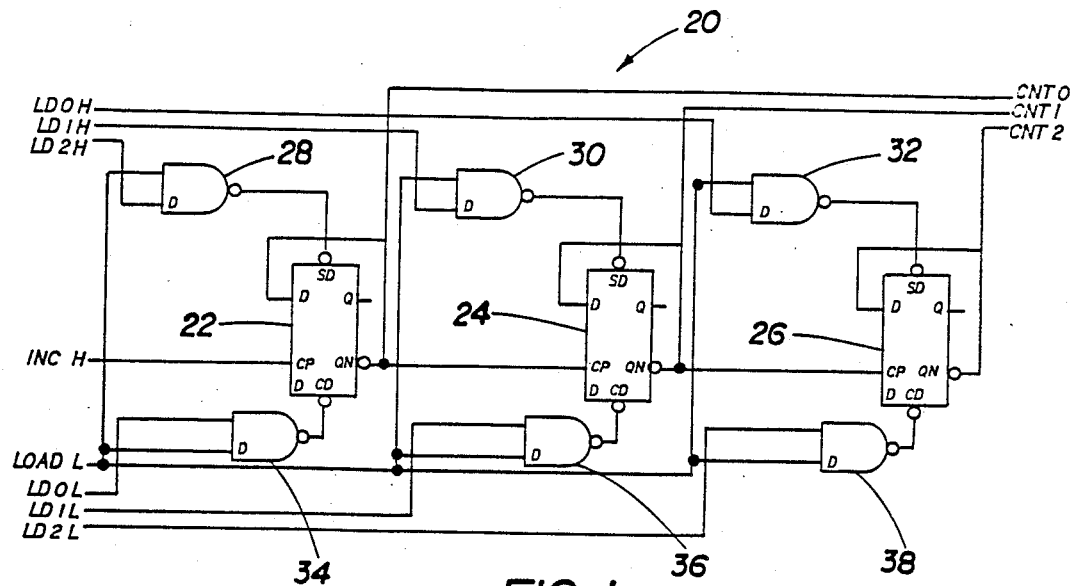

In FIG. 1 is shown common prior art loadable ripple counter 20 that employs NAND gates 28–38 to control the set and clear functions of D-flip-flops 22, 24, 26 to load counter 20 with a three bit number indicated by the LD0H, LD1H, LD2H, LD0L, LD1L, and LD2L inputs. Counter 20 counts INC H pulses provided to flip-flop 22, the least significant bit flip-flop. The complement output of each flip-flop clocks the next flip-flop (except for flip-flop 26), is used as a bit of the three-bit counter output (CN0, CN1, CN2), and is provided to its D input (causing each flip flop 22, 24, 26 to alternate its output every clock period). A counter of this configuration has twelve gates and eight nets, i.e., connections between components, for each output bit when implemented in a gate array using a DEC15GA gate array library.

STRUCTURE OF THE PREFERRED EMBODIMENTS

Figure 2:
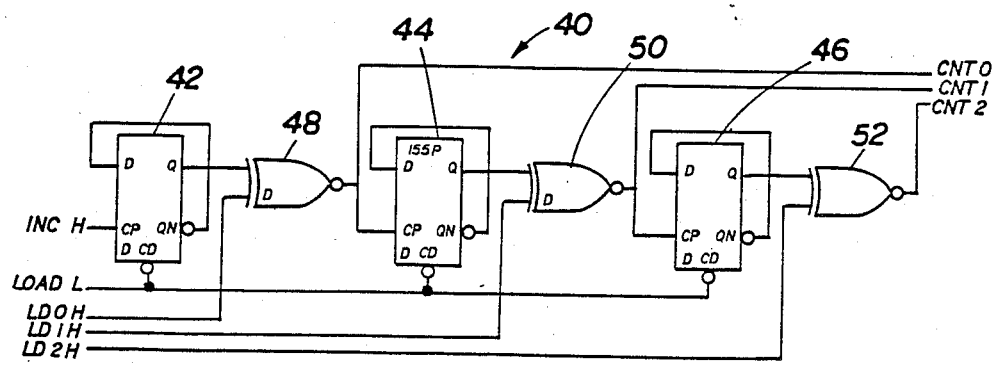
FIG. 2 is a schematic of a loadable three-bit ripple counter according to the invention.

Referring to FIG. 2, ripple counter 40 utilizes clearable D-flip-flops 42, 44, and 46 and exclusive-NOR gates 48, 50, 52. Counter 40 counts pulses provided as the INC H input, provides a three bit parallel output (CNT0, CNT1, CNT2), and is loaded with a three-bit parallel input (LD0H, LD1H, LD2H). Flip-flops 42, 44, 46 are connected to be cleared by a flip-flop control signal, LOAD L. The complement output of each flip-flop 42, 44, 46 is connected to its corresponding D input, causing each flip-flop to alternate its output every clock pulse. The true output of flip-flop 42 is inputted to exclusive-NOR gate 48, which is also inputted with the least significant bit, LD0H, of the loaded number. The output of gate 48 is outputted as CNT0 and clocks flip-flop 44. The true output of flip-flop 44 is inputted to gate 50, which is also inputted with the second bit, LD1H, of the loaded number. The output of gate 50 is outputted as CNT1 and clocks flop-flop 46. The true output of flip-flop 46 is inputted to gate 52, which is also inputted with the third bit, LD2H, of the loaded number. The output of gate 52 is outputted as CNT2. A counter of this configuration utilizes eleven gates and five nets for each output bit when implemented in a gate array using a DEC15GA gate array library.

Figure 3:
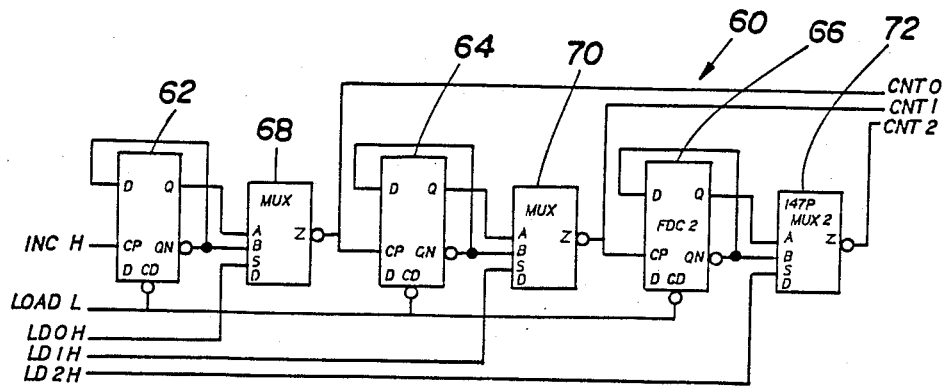
FIG. 3 is a schematic of an alternative embodiment of a loadable three-bit ripple counter according to the invention.

Referring to FIG. 3, ripple counter 60 utilizes clearable D-flip-flops 62, 64, 66 and two-to-one multiplexers 68, 70, 72. Like counter 40, counter 60 counts pulses provided as the INC H input, provides a three-bit parallel output (CNT0, CNT1, CNT2), and is loaded with a three bit parallel input (LD0H, LD1H, LD2H). Flip-flops 62, 64, 66 are connected to be cleared by a flip-flop control signal, LOAD L. The true outputs of flip-flops 62, 64, and 66 are inputted to the A inputs of multiplexers 68, 70, and 22. The complement outputs of flip-flops 62, 64, 66 are inputted to their own D inputs (to provide alternating flip-flop outputs) and are inputted to the B inputs of multiplexers 68, 70, 72, respectively. The three-bit parallel inputs, LD0H, LD1H, and LD2H, of the loaded number are inputted to the control inputs, S, of multiplexers 68, 70, and 72, respectively. The output of multiplexer 68 is outputted as CNT0 and inputted as the clock for flip-flop 64. The output of multiplexer 70 is outputted as CNT1 and inputted as the clock for flip-flop 66. The output of multiplexer 72 is outputted as CNT2. A counter of this configuration utilizes ten gates and six nets for each output bit when implemented as a gate array using a DEC15GA gate array library.

OPERATION OF THE PREFERRED EMBODIMENTS

Referring to FIG. 2, counter 40 is loaded with the loaded number indicated by the states of LD0H, LD1H, LD2H by asserting the flip-flop control signal, LOAD L. This clears the outputs of flip-flops 42, 44, and 46, in turn causing the outputs of gates 48, 50, 52, and thus the three bits of the counter output, CNT0, CNT1, CNT2, to be determined by the states of LD0H, LD1H, and LD2H. When LOAD L is deasserted, counter 40 counts INC H pulses. As each INC H pulse is received, the CNT0 bit of counter 40 transitions to the logical NOT of its current state. If this transition is from one to zero, then the next bit in the counter chain is clocked. This process "ripples" through to the most significant bit of counter 40. LD0H, LD1H, and LD2H must remain stable during the counting in order to allow the outputs of gates 48, 50, 52 to be affected by LD0H, LD1H, LD2H. Gates 48, 50, 52 thus act as bit-loading elements that each permit counter 40 to be loaded with a respective bit.

Referring to FIG. 3, counter 60 is loaded by asserting the flip-flop control signal, LOAD L, which clears the true outputs and sets the complement outputs of flip-flops 62, 64, and 66. The counter output, which is the output of multiplexers 68, 70, and 72, is now determined by the states of LD0H, LD1H, and LD2H, which are fed to the S multiplexer inputs. If the S input is high, multiplexers 68, 70, and 72 output the true input; if the S input is low, multiplexers 68, 70, 72 output the complement input. When the flip-flop control signal, LOAD L, is deasserted, counter 60 functions substantially the same as counter 40, the S inputs determining whether the true or complement outputs are passed through multiplexers 68, 70, 72. Multiplexers 68, 70, 72 thus act as bit loading elements that each permit counter 60 to be loaded with a respective bit.

Loadable ripple counters 40, 60 are advantageous in that they use fewer gates and nets than the prior art, thereby saving space. In integrated circuits employing a plurality of ripple counters according to the invention, the savings in space may permit use of a smaller die size. Ripple counters according to the invention also do not require settable flip-flops but can employ simpler, less-expensive flip-flops.

OTHER EMBODIMENTS

Other embodiments of the invention are within the scope of the following claims. E.g., the invention is applicable to both up counters, as in FIGS. 2 and 3, and to down counters.

What is claimed is:
1. A loadable N-bit ripple counter comprising N bit subcircuits, each said bit subcircuit providing a single bit output of the N-bit counter output, a less significant bit subcircuit clocking the next more significant bit subcircuit, said counter output being a function of a predetermined N-bit loaded binary word, each bit subcircuit comprising
   a flip-flop configured to alternate its flip-flop output every time that it receives a clock pulse, said least significant bit flip-flop receiving a clock external of said ripple counter, said flip-flop having means to control said flip-flop output to a known state when a flip-flop control signal is asserted, said known state remaining until said control signal is deasserted, and
   a bit loading element connected to receive said flip-flop output and a bit input of said predetermined N-bit word being loaded and to provide a bit output of said counter, said bit output being controlled by the states of said flip-flop output and said bit input, said bit output of said bit loading element, except for the most significant bit, being also connected to serve as a clock for the next more significant bit subcircuit.

2. The counter of claim 1 wherein said bit loading element comprises a gate.

3. The counter of claim 2 wherein said bit loading element comprises an exclusive-NOR gate.

4. The counter of claim 1 wherein
   said flip flop has a true output and a complement output, and
   said bit loading element comprises a multiplexer having two signal inputs connected to respectively receive said true output and complement output and a control input connected to receive said bit input, said multiplexer providing either said true output or complement output as its output, depending on the state of its bit input.

5. The counter of claim 1 wherein said means to control said output includes a means for clearing said flip-flop, thereby causing said flip-flop output to be low.

6. The counter of claim 1 wherein said flip-flop output is connected to a D-input of said flip-flop to cause its output to alternate state.

7. The counter of claim 1 wherein said flip-flops and bit loading elements are implemented as gate arrays.

8. The counter of claim 3 wherein said flip-flops and bit loading elements are implemented as gate arrays.

9. The counter of claim 4 wherein said flip-flops and bit loading elements are implemented as gate arrays.

* * * * *